US007414851B2

(12) United States Patent
You

(10) Patent No.: US 7,414,851 B2
(45) Date of Patent: Aug. 19, 2008

(54) DISPLAY APPARATUS AND FLEXIBLE SUBSTRATE

(75) Inventor: Se Joon You, Seoul (KR)

(73) Assignee: LG Electronics Inc. (KR)

( * ) Notice: Subject to any disclaimer, the term of this patent is extended or adjusted under 35 U.S.C. 154(b) by 0 days.

(21) Appl. No.: 11/364,085

(22) Filed: Mar. 1, 2006

(65) Prior Publication Data
US 2006/0198106 A1    Sep. 7, 2006

(30) Foreign Application Priority Data
Mar. 3, 2005    (KR) ............... 10-2005-0017936

(51) Int. Cl.
*H05K 7/20* (2006.01)
*H05K 9/00* (2006.01)
*G02F 1/1345* (2006.01)
*G09G 3/28* (2006.01)

(52) U.S. Cl. ............ 361/719; 361/704; 361/751; 361/816; 361/818; 349/150; 345/60; 345/905

(58) Field of Classification Search ........... 361/702, 361/707, 749–751, 704, 719, 800, 816, 818; 349/68, 150–151; 174/51, 68.1, 254, 252; 313/511
See application file for complete search history.

(56) References Cited

U.S. PATENT DOCUMENTS

| | | | | |
|---|---|---|---|---|
| 4,680,675 A * | 7/1987 | Sato | ............... | 361/748 |
| 6,534,722 B2 * | 3/2003 | Takaoka | ............... | 174/254 |
| 6,657,620 B2 * | 12/2003 | Oishi et al. | ............... | 345/204 |
| 6,703,702 B2 * | 3/2004 | Inoue et al. | ............... | 257/684 |
| 2005/0051888 A1 * | 3/2005 | Kim | ............... | 257/706 |
| 2005/0110936 A1 * | 5/2005 | Kim et al. | ............... | 349/150 |
| 2005/0111175 A1 * | 5/2005 | Kim | ............... | 361/681 |
| 2007/0188692 A1 * | 8/2007 | Fukusako et al. | ............... | 349/150 |

FOREIGN PATENT DOCUMENTS

| | | | |
|---|---|---|---|
| JP | 10143083 A | * | 5/1998 |
| JP | 10282895 A | * | 10/1998 |
| JP | 11-282895 | | 10/1999 |
| JP | 11298094 A | * | 10/1999 |
| JP | 2000091884 A | * | 3/2000 |
| JP | 2001326879 A | * | 11/2001 |
| JP | 2005327850 A | * | 11/2005 |
| KR | 1020050000617 A | * | 1/2005 |
| KR | 1020050000617 A | | 6/2005 |
| WO | WO 2005088711 A1 | * | 9/2005 |

* cited by examiner

*Primary Examiner*—Jayprakash Gandhi
*Assistant Examiner*—Robert J Hoffberg
(74) *Attorney, Agent, or Firm*—Fish & Richardson P.C.

(57) ABSTRACT

The present invention relates to a flexible substrate. More particularly, the present invention relates to a flexible substrate for a display apparatus. A display apparatus according to an embodiment of the present invention comprises a display panel in which an electrode is formed, a heat sink plate formed on a rear side of the display panel, a driving board formed on a rear side of the heat sink plate, and a flexible substrate for connecting the electrode and the driving board, wherein the flexible substrate is directly grounded to the heat sink plate. Accordingly, the noise of pulses supplied from the flexible substrate can be prevented and damage to the flexible substrate can be prohibited.

3 Claims, 7 Drawing Sheets

DISPLAY APPARATUS AND FLEXIBLE SUBSTRATE

This Nonprovisional application claims priority under 35 U.S.C. § 119(a) on Patent Application No. 10-2005-0017936 filed in Korea on Mar. 3, 2005 the entire contents of which are hereby incorporated by reference.

BACKGROUND OF THE INVENTION

1. Field of the Invention

The present document relates to a flexible substrate. More particularly, the present document relates to a flexible substrate for a display apparatus.

2. Description of the Related Art

A flexible substrate is used to reduce the cost price and the workability of display apparatuses such as a Liquid Crystal Display (LCD), a Plasma Display Panel (PDP) and an Organic Electro Luminescent Display (OELD). For example, if a Tape Carrier Package (TCP) (i.e., one of the flexible substrates) is used as the package of the data driver Integrated Circuit (IC) chip of the display apparatus, the cost of the package itself can be saved and there are several advantages in terms of the process since the package supply and attachment processes can be automated.

The flexible substrate includes a Chip on Film (COF) and a TCP in which an IC chip is packaged, and a Flexible Printed Circuit (FPC) in which a circuit is simply patterned.

FIG. 1 is a drawing illustrating a display apparatus in the related art.

FIG. 1 shows an example of a flexible substrate used for a plasma display apparatus of the display apparatuses. As shown in FIG. 1, the plasma display apparatus has a control board 20, a data driving board 21, a flexible substrate 23, a plasma display panel 22 and a scan/sustain driving board 24. Each of the boards 20, 21 and 24 is directly grounded (GND) to a heat sink plate (not shown) formed on a rear side of the plasma display panel 22. There occurs a difference in the impedance between the grounds (GND) of the boards 20, 21 and 24 because of several causes.

Meanwhile, the flexible substrate 23 has a ground structure connected to the heat sink plate through the data driving board 21. Accordingly, problems arise because the flexible substrate 23 is influenced by pulses supplied from the driving boards 21 and 24 to the plasma display panel 22 and is vulnerable to electromagnetic interference. In other words, there are problems in that noise is generated in the pulses supplied through the flexible substrate and in even worse conditions, IC chips formed in the flexible substrate are failed.

SUMMARY OF THE INVENTION

Accordingly, an object of the present invention is to solve at least the problems and disadvantages of the related art.

It is an object of the present invention to provide a display apparatus in which the noise of pulses occurring when the display apparatus is driven can be prevented and damage to the apparatus can be prohibited.

It is another object of the present invention to provide a flexible substrate for accomplishing the above object.

A display apparatus according to an embodiment of the present invention comprises a display panel in which an electrode is formed, a heat sink plate formed on a rear side of the display panel, a driving board formed on a rear side of the heat sink plate, and a flexible substrate for connecting the electrode and the driving board, wherein the flexible substrate is directly grounded to the heat sink plate.

A display apparatus according to another embodiment of the present invention comprises a display panel in which an electrode is formed, a heat sink plate formed on a rear side of the display panel, a driving board formed on a rear side of the heat sink plate, and a Tape Carrier Package (TCP) for connecting the electrode and the driving board, wherein the flexible substrate is directly grounded to the heat sink plate.

A flexible substrate according to an embodiment of the present invention comprises a non-conduction film, and a ground pattern layer formed on the non-conduction film with at least one hole.

The present invention is advantageous in that it can prevent the noise of pulses supplied from the flexible substrate and can prohibit damage to the flexible substrate.

BRIEF DESCRIPTION OF THE DRAWINGS

The invention will be described in detail with reference to the following drawings in which like numerals refer to like elements.

DETAILED DESCRIPTION OF PREFERRED EMBODIMENTS

Figure 1:
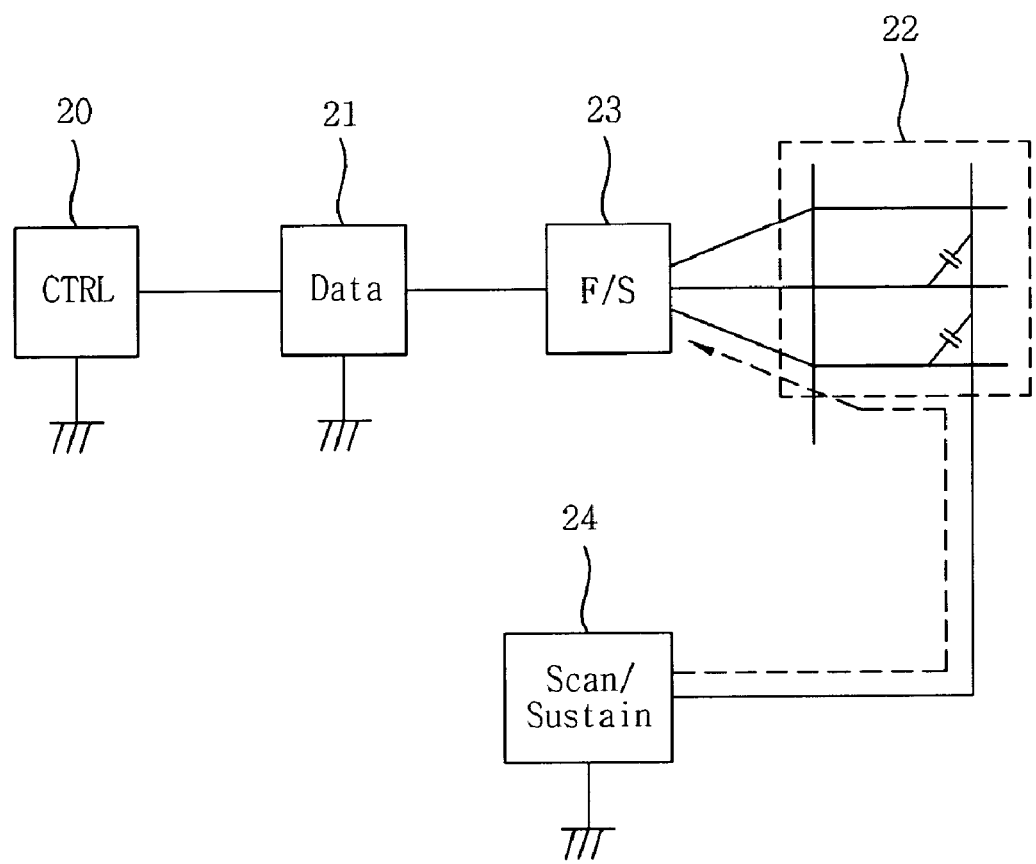
FIG. 1 is a drawing illustrating a display apparatus in the related art.

Preferred embodiments of the present invention will be described in a more detailed manner with reference to the drawings.

A display apparatus according to an embodiment of the present invention comprises a display panel in which an electrode is formed, a heat sink plate formed on a rear side of the display panel, a driving board formed on a rear side of the heat sink plate, and a flexible substrate for connecting the electrode and the driving board, wherein the flexible substrate is directly grounded to the heat sink plate.

The flexible substrate may comprise a ground pattern layer directly connected to the heat sink plate.

The flexible substrate may comprise an Integrated Circuit (IC) chip connected to the ground pattern layer.

The flexible substrate may have a hole formed therein, wherein the hole couples the flexible substrate with the heat sink plate and directly grounds the flexible substrate to the heat sink plate.

The flexible substrate may comprise the ground pattern layer exposed near the hole.

The flexible substrate and the heat sink plate may be coupled by one of a screw, a rivet or a pin through the hole.

Either a hole or a groove corresponding to the hole formed in the flexible substrate may be formed in the heat sink plate.

The display apparatus may further comprise an adhesive formed on a front side or rear side of the flexible substrate.

The adhesive may be either a heat sink tape or heat sink grease.

The hole may be formed in an area spaced at a predetermined distance from the adhesive formed.

The hole may be formed in a portion spaced at a predetermined distance from a top or bottom of the IC chip formed in the flexible substrate.

The flexible substrate may comprise a ground pattern layer exposed in such a way to be directly grounded to the heat sink plate.

The exposed ground pattern layer may be directly grounded by a conductive adhesive.

The conductive adhesive may comprise an anisotropic conductive film.

The display apparatus may further comprise a support frame in contract with the heat sink plate for supporting the flexible substrate.

A display apparatus according to another embodiment of the present invention comprises a display panel in which an electrode is formed, a heat sink plate formed on a rear side of the display panel, a driving board formed on a rear side of the heat sink plate, and a Tape Carrier Package (TCP) for connecting the electrode and the driving board, wherein the flexible substrate is directly grounded to the heat sink plate.

The TCP may have a hole formed therein, wherein the hole couples the flexible substrate with the heat sink plate and directly grounds the flexible substrate to the heat sink plate.

A flexible substrate according to an embodiment of the present invention comprises a non-conduction film, and a ground pattern layer formed on the non-conduction film with at least one hole.

A part of the ground pattern layer may be exposed. The flexible substrate may further comprise an IC chip connected to the ground pattern layer.

Other objects, advantages and salient features of embodiments of the present invention will become more apparent from the following detailed description taken in conjunction with the annexed drawings, which disclose embodiments of the invention. Like reference numerals designate like elements throughout.

Detailed embodiments of the present invention will be described below with reference to the accompanying drawings.

First Embodiment

Figure 2:
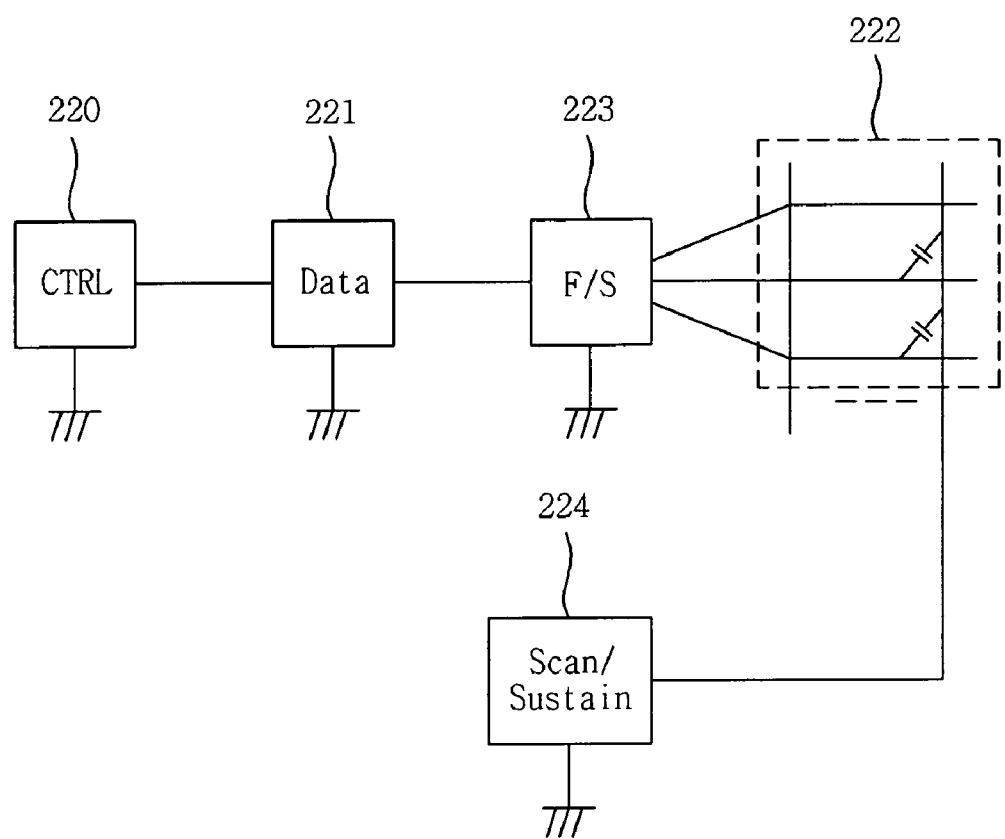
FIG. 2 is a drawing illustrating a display apparatus according to a first embodiment of the present invention.

FIG. 2 is a drawing illustrating a display apparatus according to a first embodiment of the present invention.

FIG. 2 shows an example of a flexible substrate used for a plasma display apparatus of the display apparatuses. As shown in FIG. 2, the plasma display apparatus comprises a control board 220, a data driving board 221, a flexible substrate 223, a plasma display panel 222 and a scan/sustain driving board 224.

The control board 220 controls the data driving board 221 and the scan/sustain driving board 224 in response to an externally input picture signal. In other words, the control board 220 controls a waveform or supply timing of a pulse supplied from each of the boards 221, 224 to the plasma display panel 222.

The data driving board 221 supplies a data pulse to an address electrode (not shown) formed in the plasma display panel 222 under the control of the control board 220.

The flexible substrate 223 connects the address electrode formed in the plasma display panel 222 and the data driving board 221. The display apparatus positions the driving boards on a rear side or lateral side of the display panel for the purpose of thinning. This requires a flexible circuit substrate in order to connect the display panel and the driving boards. The flexible substrate 223 comprises an IC chip that connects the display panel and the driving boards and also controls the pulses supplied from the driving boards to be supplied to the display panel. The flexible substrate having the IC chip may include a COF and a TCP.

The flexible substrate 223 according to the first embodiment of the present invention has a ground structure unlike the related art. In the related art, the flexible substrate has an indirect ground structure in which the flexible substrate is grounded to the heat sink plate through the data driving board, as shown in FIG. 1. In the first embodiment of the present invention, however, the flexible substrate 223 has a direct ground structure in which it is directly grounded to the heat sink plate (not shown). Accordingly, the flexible substrate 223 may have a strengthened ground structure which is strong against the influence of the pulses from the driving boards or the influence of EMI. The structure of the flexible substrate 223 according to the first embodiment of the present invention and a connection relationship between the flexible substrate and other elements will be described in more detail later on with reference to FIGS. 3 to 8.

The plasma display panel 222 has a front panel (not shown) and a rear panel (not shown) coalesced at a predetermined distance. A plurality of scan electrodes and sustain electrodes are formed in parallel in the front panel. A plurality of address electrodes crossing the scan electrodes and the sustain electrodes are also formed in the rear panel. The electrodes are respectively supplied with driving pulses from the driving boards 221, 224. Plasma discharge is generated according to the supplied driving pulses and an image is implemented by discharge light.

The scan/sustain driving board 224 supplies the driving pulses to the scan electrodes or the sustain electrodes (not shown) formed in the plasma display panel 222 under the control of the control board 220. In FIG. 2, the scan/sustain driving board 224 is shown as one block for convenience of description. However, the scan/sustain driving board may be constructed with it being divided into a scan driving board and a sustain driving board.

Figure 3:
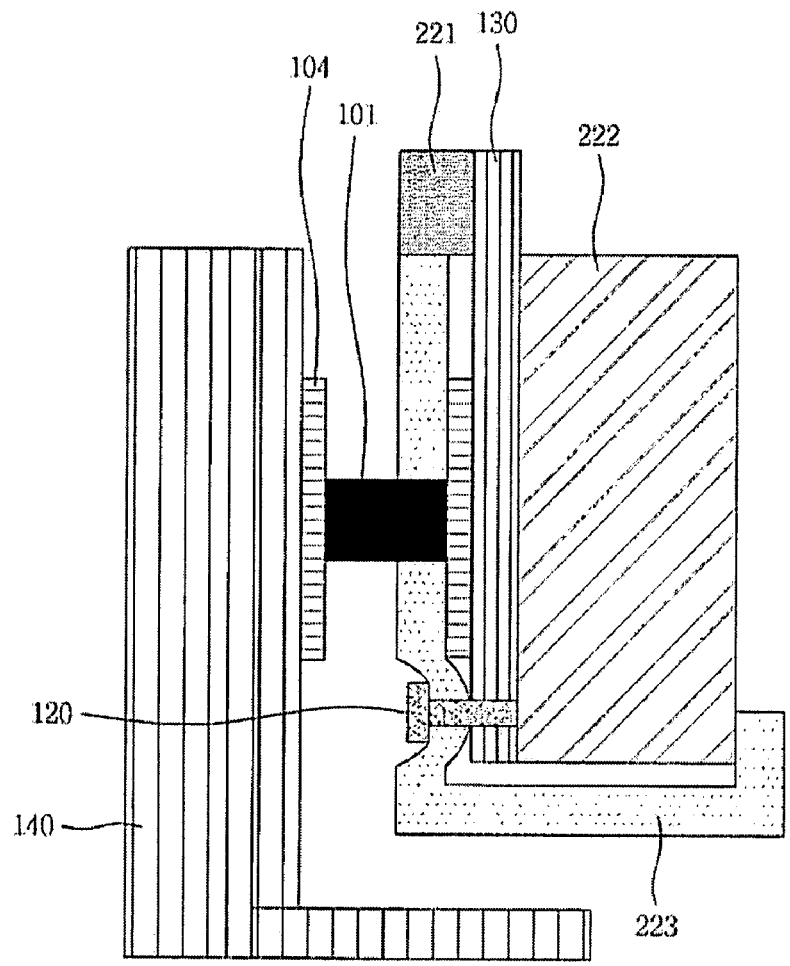
FIG. 3 is a drawing illustrating a structure of the display apparatus according to the first embodiment of the present invention.

FIG. 3 is a drawing illustrating a structure of the display apparatus according to a first embodiment of the present invention.

FIG. 3 shows an actual structure of the plasma display apparatus shown in FIG. 2, and it shows the ground structure of the flexible substrate and a connection relationship between the flexible substrate and other element. As shown in FIG. 3, the plasma display apparatus comprises the plasma display panel 222, a heat sink plate 130, the data driving board 221 and the flexible substrate 223.

The plasma display panel 222 is a display side on which an image of the plasma display apparatus is displayed. The heat sink plate 130 is formed on the rear side of the plasma display panel 222.

The heat sink plate 130 supports the plasma display panel 222 and the data driving board 221. The heat sink plate 130 discharges heat generated from the plasma display panel 222 and the data driving board 221 to the outside and is used as ground means of the driving boards described with reference to FIG. 2.

The data driving board 221 is formed on the rear side of the heat sink plate 130. The data driving board 221 is connected to the flexible substrate 223 and supplies the data pulse to the plasma display panel 222.

The flexible substrate 223 connects the data driving board 221 and the address electrodes (not shown) formed in the plasma display panel 222. Accordingly, a bent shape is formed from the front side of the plasma display panel 222 to the rear side of the heat sink plate 130.

Furthermore, the flexible substrate 223 comprises a ground pattern layer (not shown) that is electrically connected to an IC chip 101 described with reference to FIG. 2. The ground pattern layer is an electrode pattern layer with conductivity and will be referred to as the ground pattern layer in the present invention. In other words, the ground pattern layer corresponds to a part of the electrode pattern layer that electrically connects the IC chip 101 to the PDP and the heat sink plate.

The flexible substrate 223 according to the first embodiment of the present invention has a hole that is coupled with the heat sink plate 130 and directly grounds the heat sink plate 130. The ground pattern layer of the flexible substrate 223 is exposed to the outside through the hole. The exposed ground pattern layer may be coupled with the heat sink plate 130 using one of a screw, a rivet or a pin. For example, FIG. 3 shows an example of the screw mating structure using a bolt 120. Therefore, the ground pattern layer is directly connected to the heat sink plate 130 and can have a more strengthened ground structure.

Furthermore, heat generated from the IC chip when the display apparatus is driven is dissipated through the heat sink plate directly connected to the ground pattern layer. Accordingly, a heat dissipation effect can be obtained.

The display apparatus according to the first embodiment of the present invention further may comprise a support frame formed between the heat sink plate 130 and the flexible substrate 223. The support frame functions to support the flexible substrate 223 and also to protect the IC chip lot.

Furthermore, an adhesive 104 that protects the IC chip 101 from external shock and dissipates heat, which is generated from the IC chip 101 when the display apparatus is driven, toward the outside is further disposed on the front or rear side of the flexible substrate 223. The adhesive 104 may be a heat sink tape or heat sink grease.

Furthermore, a heat sink 140 for dissipating heat generated from the IC chip 101 when the display apparatus is driven toward the outside is further disposed on the flexible substrate 223.

Meanwhile, the TCP of the flexible substrate according to the first embodiment of the present invention has a structure in which the IC chip is formed on the flexible substrate and is a flexible substrate that is generally used in the display apparatus. The TCP is very vulnerable to noise and EMI in terms of the structure. Accordingly, a significant advantage can be obtained by applying the ground structure according to the first embodiment of the present invention to the TCP. The ground structure according to the first embodiment of the present invention will be described by taking the TCP as an example.

Figure 4:
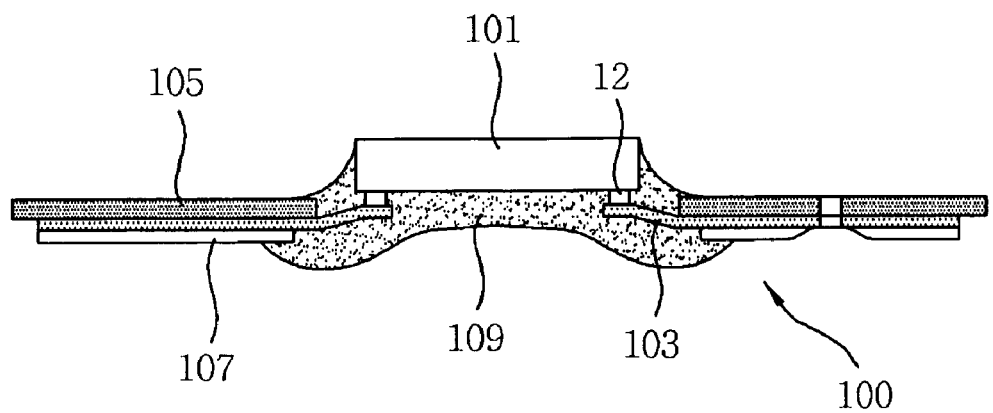
FIG. 4 is a drawing illustrating a structure of a flexible substrate according to the first embodiment of the present invention.

FIG. 4 is a drawing illustrating the structure of the flexible substrate according to the first embodiment of the present invention.

FIG. 4 shows the TCP of the flexible substrate according to the first embodiment of the present invention. As shown in FIG. 4, the TCP 100 comprises an IC chip 101 made of a semiconductor material, ground pattern layers 103 that are connected by the IC chip 101 and a bumper 12 and are made of metal with a high electrical conductivity, such as copper (Cu), base films 105 formed on the ground pattern layers 103, solder resists 107 coated to prevent unnecessary solder from being attached on the ground pattern layers 103, and sealing resin 109 sealing them. It has been shown in FIG. 4 that the solder resists 107 are coated only on one side of the ground pattern layers 107. It is, however, to be understood that the solder resists 103 may be coated on both sides of the ground pattern layers 107.

The ground pattern layers 103 according to the first embodiment of the present invention may have at least one hole 103-1 formed therein. A part of the ground pattern layers 103 is exposed to the outside through the hole 103-1.

A hole 105-1 corresponding to the hole 103-1 of the ground pattern layers is formed in the base films 105. The solder resists 107 have non-conductivity. Accordingly, it is preferred that the solder resists 107 be not formed around a portion corresponding to the hole formed in the ground pattern layers 103 in order to widen the exposed area of the ground pattern layers 103.

Figure 5:
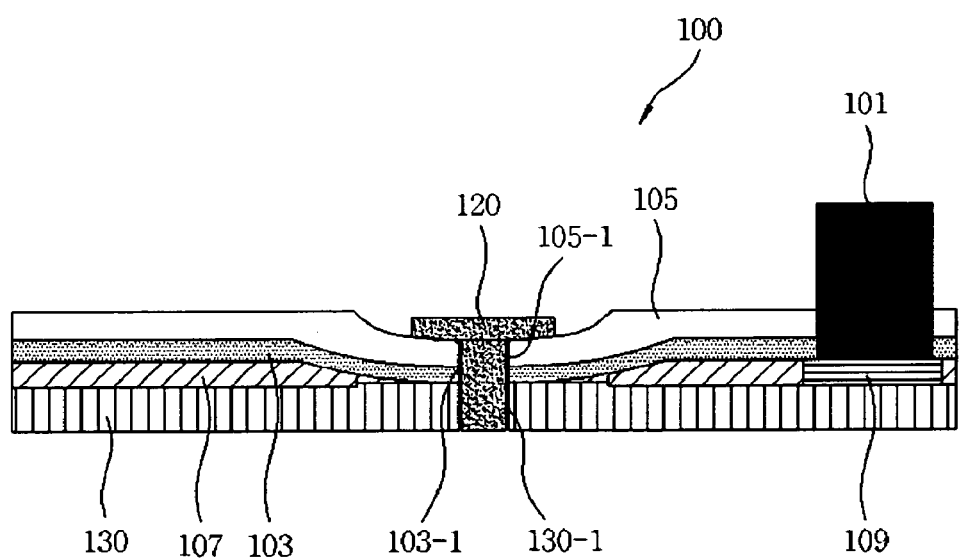
FIG. 5 is a drawing illustrating a ground structure of the flexible substrate according to the first embodiment of the present invention.

FIG. 5 is a drawing illustrating the ground structure of the flexible substrate according to the first embodiment of the present invention.

FIG. 5 shows the structure in which the TCP 100 of FIG. 4 is coupled with the display apparatus. As shown in FIG. 5, in the TCP 100 according to the first embodiment of the present invention, the ground pattern layers 103 are exposed to the outside through the solder resists 107. At least one hole 103-1 is formed in the exposed ground pattern layers 103. The TCP 100 is electrically connected to the heat sink plate 130 by means of the bolt 120 coupled with the heat sink plate 130 through the hole 103-1.

Holes 105-1, 130-1 corresponding to the hole 103-1 of the ground pattern layers maybe preferably formed in the base films 105 and the heat sink plate 130, respectively. Either a hole or a groove maybe formed in the heat sink plate 130. In the case where the support frame is formed between the heat sink plate 130 and the TCP 100, either the hole or the groove may be formed in the support frame. Furthermore, the solder resist 107 may not be coated on a portion where the hole 103-1 of the ground pattern layer 103 is formed or a corresponding portion of the solder resist 107 after the coating may be removed in order to widen the external exposed area of the ground pattern layers.

Figure 6:
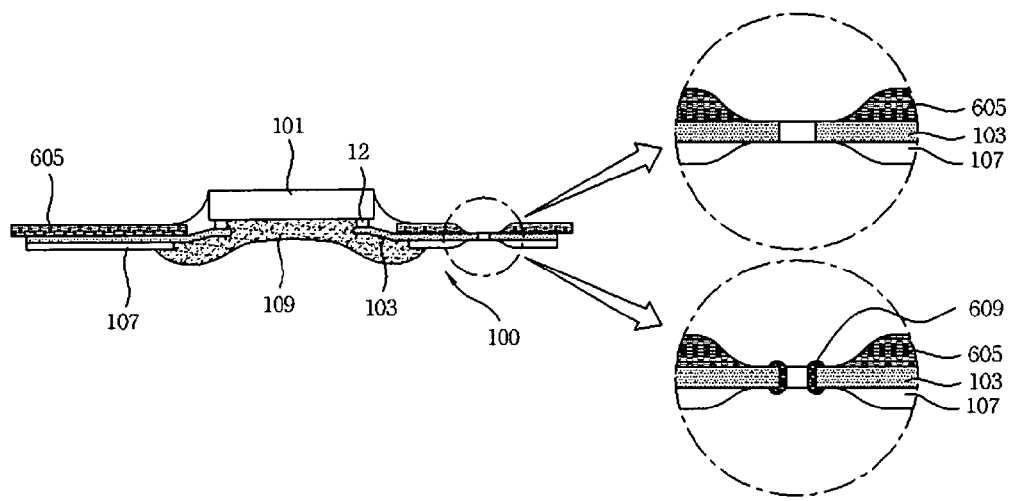
FIG. 6 is a drawing illustrating another structure of the flexible substrate according to the first embodiment of the present invention.

FIG. 6 is a drawing illustrating another structure of the flexible substrate according to the first embodiment of the present invention.

As shown in FIG. 6, in another structure of the TCP according to the first embodiment of the present invention, a base film 605 is not formed near a portion corresponding to the hole formed in the ground pattern layer 103. Accordingly, the exposed area of the ground pattern layer 103 toward the base film 605 can be further widened. Furthermore, to improve the ground efficiency, a conductive film 609 may be formed in the hole of the ground pattern layer and the front and rear sides of the exposed ground pattern layer.

In the above description regarding another structure of the flexible substrate according to the first embodiment of the present invention, the same description as that of FIG. 4 will be omitted.

Figure 7:
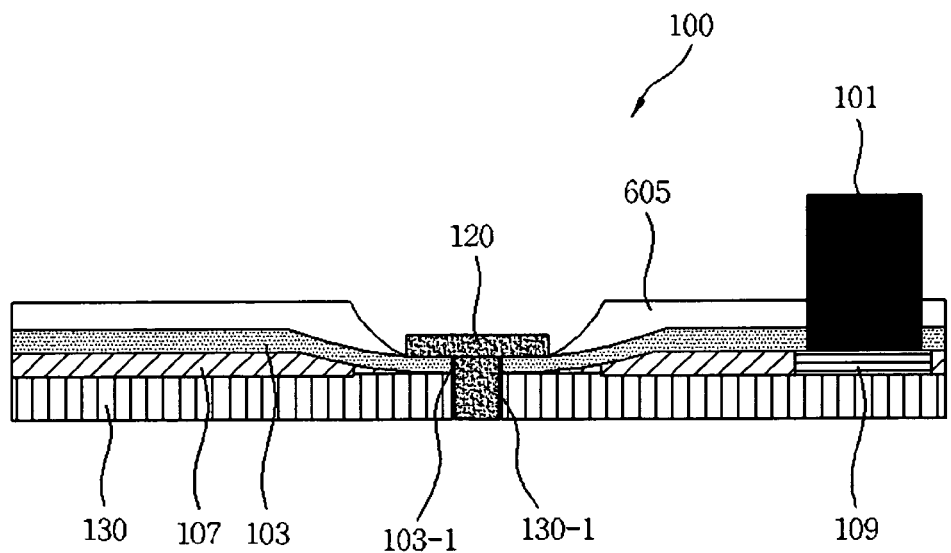
FIG. 7 is a drawing illustrating another ground structure of the flexible substrate according to the first embodiment of the present invention.

FIG. 7 is a drawing illustrating another ground structure of the flexible substrate according to a first embodiment of the present invention.

FIG. 7 shows a structure in which the TCP of FIG. 6 is coupled with the display apparatus. As shown in FIG. 7, in the TCP 100 according to the first embodiment of the present invention, the ground pattern layer 103 is exposed to the outside though the base film 605 and the solder resist 107. At least one hole 103-1 is formed in the exposed ground pattern layer 103. The TCP 100 is electrically connected to the heat sink plate 130 by means of the bolt 120 coupled to the heat sink plate 130 through the hole 103-1. A contact area of the bolt 120 with the conductivity and the ground pattern layer 103 exposed toward the base film 605 is increased, thereby providing more reliable ground.

Furthermore, the base film 605 and the solder resist 107 may not be coated on a portion where the hole 103-1 of the ground pattern layers 103 is formed or a corresponding portion of the solder resist 107 after the coating may be removed in order to widen the external exposed area of the ground pattern layer.

Figure 8:
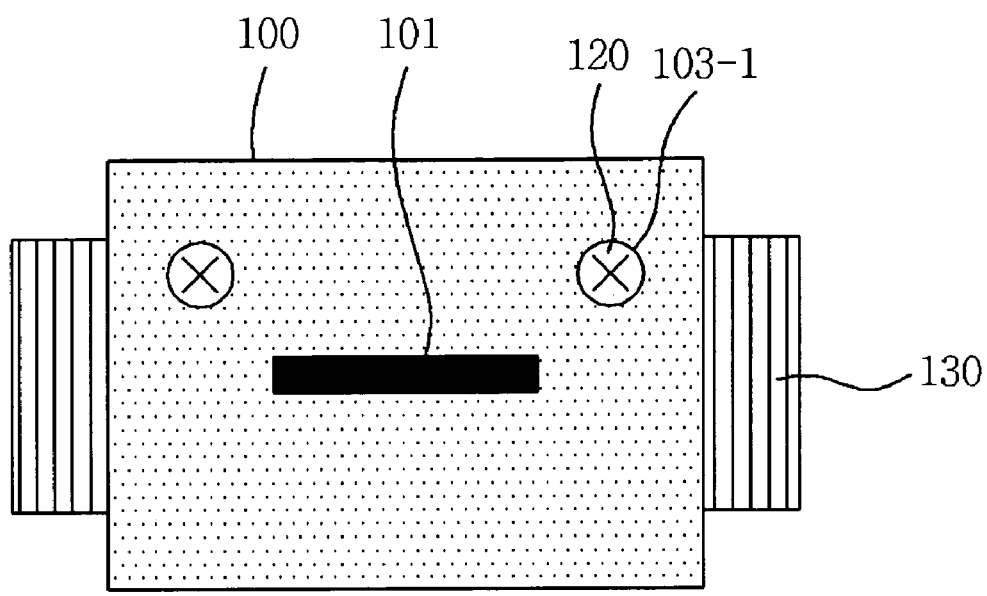
FIG. 8 shows that a flexible substrate and a heat sink plate are coupled according to an embodiment of the present invention.

FIG. 8 shows that the flexible substrate and the heat sink plate are coupled according to an embodiment of the present invention.

As shown in FIG. 8, the hole 103-1 with which the bolt 120 will be coupled is formed at a portion, which is spaced at a predetermined distance from a portion where the adhesive (not shown) is formed. This is because the adhesive formed at the bottom of the IC chip 101 has a predetermined thickness in order to protect the IC chip 101 and to dissipate heat.

As the adhesive has a predetermined thickness, a step is caused at the portion where the adhesive is formed between the TCP 100 and the heat sink plate 130. Accordingly, there is a possibility that ground failure may occur due to the step. To prevent such ground failure, a hole may be formed at the portion, which is spaced at a predetermined distance from the top and bottom of the IC chip 101 where the TCP 100 is formed.

Second Embodiment

Even in the second embodiment of the present invention, the ground pattern layer included in the flexible substrate is directly grounded to the heat sink plate as in the first embodiment of the present invention. The structure of the flexible substrate according to the second embodiment of the present invention and the ground structure of the flexible substrate accordingly will be described by taking a TCP as an example. The same description as that of the first embodiment will be omitted.

Figure 9:
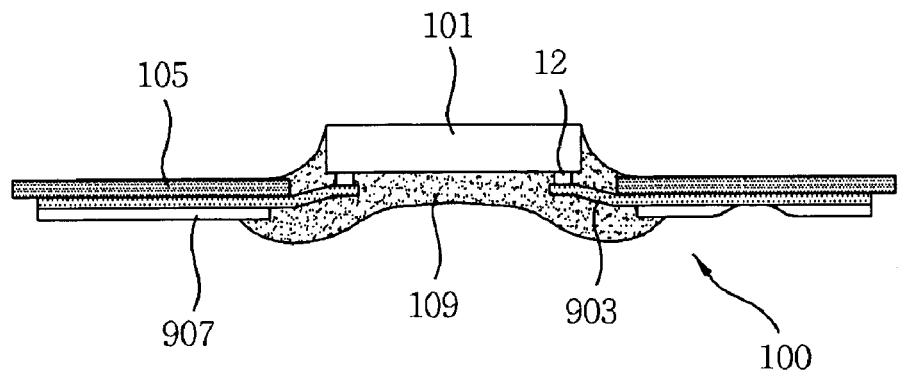
FIG. 9 is a drawing illustrating a structure of a flexible according to a second embodiment of the present invention.

FIG. 9 is a drawing illustrating the structure of a flexible according to a second embodiment of the present invention.

FIG. 9 shows the TCP of the flexible substrate according to the second embodiment of the present invention. As shown in FIG. 9, the TCP 100 includes an IC chip 101, a ground pattern layer 903, a base film 105, a solder resist 907 and a sealing resin 109.

The solder resist 907 according to the second embodiment of the present invention is partially removed and a surface of the ground pattern layer 903 is exposed directly to the outside. The solder resist 907 may not be coated on a predetermined portion through which the ground pattern layer 903 is exposed or a corresponding portion may be removed after the coating, so that the ground pattern layer is exposed to the outside.

Figure 10:
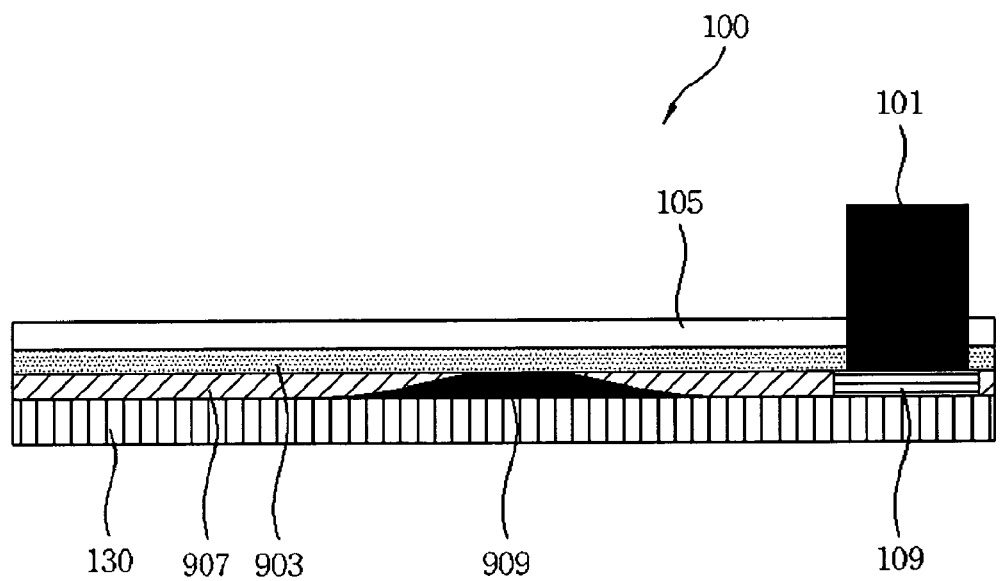
FIG. 10 is a drawing illustrating a ground structure of the flexible substrate according to the second embodiment of the present invention.

FIG. 10 is a drawing illustrating a ground structure of the flexible substrate according to a second embodiment of the present invention.

FIG. 10 shows a structure in which the TCP of FIG. 9 is coupled with the display apparatus. As shown in FIG. 10, in the TCP 100 according to the second embodiment of the present invention, the ground pattern layer 903 is directly exposed to the outside through the solder resist 907. The exposed ground pattern layer 903 is directly grounded to the heat sink plate 130.

The exposed ground pattern layer 903 is adhered with the heat sink plate 130 by means of a conductive adhesive 909 and can be directly grounded thereto. The conductive adhesive 909 may include an anisotropic conductive film.

As described above, in the embodiments of the present invention, the ground pattern layer and the heat sink plate of the flexible substrate are directly connected. Accordingly, the generation of noise when the display apparatus is driven can be prohibited and damage to the flexible substrate can be solved. In addition, the present invention is advantageous in that it can improve the heat dissipation effect since the ground pattern layer is connected to the heat sink plate The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A display apparatus comprising:
    a display panel in which an electrode is formed;
    a heat sink plate arranged on a rear side of the display panel;
    a driving board for applying a driving signal to the electrode; and
    a flexible substrate for connecting electrically the electrode to the driving board, the flexible substrate including a ground pattern layer, a base film formed on the ground pattern layer and a solder resist layer underlying the ground pattern layer,
    wherein the flexible substrate is directly grounded to the heat sink plate using one of a screw, a rivet or a pin coupled with the heat sink plate through a hole of the flexible substrate,
    wherein the base film is not formed around the hole of the flexible substrate to expose a portion of the ground pattern layer.

2. The display apparatus of claim 1, wherein the flexible substrate comprises an Integrated Circuit(IC) chip.

3. The display apparatus of claim 2, wherein an adhesive is formed between the heat sink plate and the Integrated Circuit (IC) of the flexible substrate.

* * * * *